(12) United States Patent
Harada et al.

(10) Patent No.: US 8,143,529 B2
(45) Date of Patent: Mar. 27, 2012

(54) LAMINATED MULTI-LAYER CIRCUIT BOARD

(75) Inventors: Toshikazu Harada, Kariya (JP); Kouji Kondo, Toyohashi (JP)

(73) Assignee: Denso Corporation, Kariya (JP)

( * ) Notice: Subject to any disclaimer, the term of this patent is extended or adjusted under 35 U.S.C. 154(b) by 818 days.

(21) Appl. No.: 11/882,132

(22) Filed: Jul. 31, 2007

(65) Prior Publication Data

US 2008/0149374 A1    Jun. 26, 2008

(30) Foreign Application Priority Data

Dec. 26, 2006 (JP) ................. 2006-350422

(51) Int. Cl.
*H05K 1/03* (2006.01)
(52) U.S. Cl. ..................................... 174/256
(58) Field of Classification Search ......... 174/254–256, 174/258, 260, 263; 361/751, 792–795
See application file for complete search history.

(56) References Cited

U.S. PATENT DOCUMENTS

| | | | |
|---|---|---|---|
| 6,841,738 B2 * | 1/2005 | Michiwaki et al. | 174/254 |
| 6,902,949 B2 * | 6/2005 | Yamazaki et al. | 438/106 |
| 2004/0112632 A1 | 6/2004 | Michiwaki et al. | |
| 2004/0134682 A1 * | 7/2004 | En et al. | 174/258 |
| 2004/0229024 A1 | 11/2004 | Harada et al. | |
| 2004/0231151 A1 | 11/2004 | Nakatani et al. | |
| 2005/0186406 A1 * | 8/2005 | Harada et al. | 428/209 |
| 2006/0008628 A1 | 1/2006 | Nakatani et al. | |

FOREIGN PATENT DOCUMENTS

| | | |
|---|---|---|
| JP | A-2003-273511 | 9/2003 |
| JP | A-2004-087944 | 3/2004 |
| JP | A-2004-111702 | 4/2004 |
| JP | A-2004-127970 | 4/2004 |
| JP | A-2006-049502 | 2/2006 |

OTHER PUBLICATIONS

Machine Translation of JP2006-049502, Harada et al., Feb. 16, 2006.*
Office Action mailed Feb. 15, 2011 in corresponding Japanese Patent Application No. 2006-350422 (English translation enclosed).
Taiwan Office Action mailed on Oct. 27, 2010 issued from the Taiwanese Patent Office in the corresponding Taiwanese patent application No. 096129840 (with English translation).

* cited by examiner

*Primary Examiner* — Jeremy Norris
*Assistant Examiner* — Tremesha S Willis
(74) *Attorney, Agent, or Firm* — Posz Law Group, PLC

(57) ABSTRACT

Plural thermoplastic resin films, each having a circuit pattern formed thereon, are laminated. Via-holes filled with conductor paste are formed in the thermoplastic films to electrically connect neighboring layers. The laminated body is pressed under heat between a pair of hot press plates to thereby form an integral body of multi-layer circuit board. To apply a uniform pressure to the laminated body in the pressing process, a projected portion formed on a pressure-adjusting sheet is pushed against a portion of the laminated body where the number of laminated circuit patterns is smaller than other portions. In this manner, the plural thermoplastic films are uniformly bonded together, and the paste in the via-holes is sufficiently converted into an alloy. Thus, reliability of the laminated multi-layer circuit board is enhanced.

15 Claims, 6 Drawing Sheets

LAMINATED MULTI-LAYER CIRCUIT BOARD

CROSS-REFERENCE TO RELATED APPLICATION

This application is based upon and claims benefit of priority of Japanese Patent Application No. 2006-350422 filed on Dec. 26, 2006, the content of which is incorporated herein by reference.

BACKGROUND OF THE INVENTION

1. Field of the Invention

The present invention relates to a laminated multi-layer circuit board that is formed into a single body under heat and pressure.

2. Description of Related Art

A method of forming a laminated multi-layer circuit board has been known hitherto. One exemplary method is disclosed in JP-A-2006-49502. In the known method, insulating layers made of thermoplastic resin and conductor layers each having a circuit pattern are alternately laminated to form a laminated body. Then, the laminated body is pressed under heat to form an integral body of the laminated multi-layer circuit board. In the pressing process, a buffer member is interposed between the laminated body and a hot press plate to apply a pressure uniformly to the laminated body. The layers are electrically connected by an inter-layer connector formed in a via-hole formed between neighboring conductor layers.

In the process forming the integral body of the multi-layer circuit board by applying pressure and heat to the laminated body, applied pressure is not uniform on the entire surface of the laminated body. This is because a larger number of circuit patters are formed at a certain place compared with other places, and the inter-layer connecting portions are not uniformly formed. By placing the buffer member between the laminated body and the hot press plate, a pressure is adjusted to be applied uniformly to the laminated body to a certain degree. However, there remains a considerably high imbalance of pressure applied to the laminated body. There is a possibility that the thermoplastic resin to which too high heat and pressure are applied flows to other places where less pressure and heat are applied. This deforms the circuit patterns, making the circuit board less reliable.

SUMMARY OF THE INVENTION

The present invention has been made in view of the above-mentioned problem, and an object of the present invention is to provide an improved laminated multi-layer circuit board that is highly reliable.

A circuit pattern is formed on a thermoplastic resin film by etching a metal layer attached on the resin film. A via-hole filled with conductor paste is formed on the circuit pattern to electrically connect circuit patterns formed on neighboring layers. Plural thermoplastic resin films having the circuit pattern are laminated, forming a laminated body. The laminated body is placed between a pair of hot press plates together with a buffer member and a pressure-adjusting sheet. To apply a substantially uniform pressure to the laminated body, a projected portion is formed on the pressure-adjusting sheet at a position where the number of circuit patterns laminated is smaller than other positions.

By applying pressure and heat to the laminated body from the pair of hot press plates, the multi-layer circuit board having plural insulating layers and conductor layers, alternately laminated, is formed. Since the projected portion of the pressure-adjusting sheet is pressed against the laminated body at a position where the number of laminated conductor layers is smaller than other positions, a substantially uniform pressure is applied to the laminated body. Therefore, the thermoplastic resin films are uniformly bonded to one another, and the paste in the via-hole is sufficiently converted into an alloy.

The projected portion formed on the pressure-adjusting sheet may be pressed against either the upper or the lower surface of the laminated body, or against both surfaces. A depressed portion corresponding to the projected portion of the pressure-adjusting sheet is formed on the surface of a unitary body of the multi-layer circuit board. A depth of the depressed portion may be made according to the number of conductor layers laminated to apply a uniform pressure to the laminated body.

According to the present invention, the laminated multi-layer circuit board is uniformly and firmly bonded, and conductor paste in the via-hole is sufficiently converted into an alloy forming an inter-layer connecting portion. Other objects and features of the present invention will become more readily apparent from a better understanding of the preferred embodiment described below with reference to the following drawings.

DETAILED DESCRIPTION OF THE PREFERRED EMBODIMENT

A preferred embodiment of the present invention will be described with reference to FIGS. 1-9. First, referring to FIGS. 1-5, a structure of a laminated multi-layer circuit board according to the present invention and a method of manufacturing the same will be described.

Figure 1A:
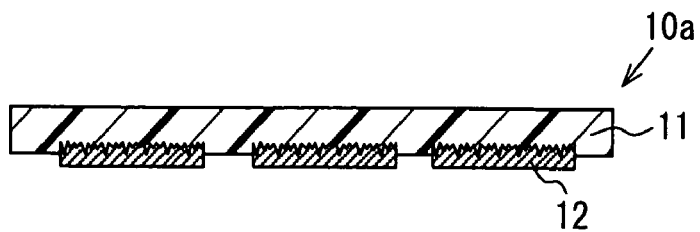
FIG. 1A is a cross-sectional view showing a pattern film composed of a thermoplastic resin film and a circuit pattern formed on the resin film.

As shown in FIG. 1A, a circuit pattern 12 is formed on one surface (on a rear surface in this particular embodiment) of a thermoplastic resin film 11, thereby making a pattern film 10a. As the thermoplastic resin film 11, a resin film made of liquid crystal polymer (LCP) having a thickness of 25-100 μm is used in this embodiment. The circuit pattern 12 is formed by etching a conductor foil pasted to the rear surface of the thermoplastic film 11. The conductor foil is made of copper (Cu) in this embodiment, but it may be made of other metals having low electric resistance, such as gold (Au), silver (Ag) or aluminum (Al). The circuit pattern 12 may be made by methods other than etching such as a printing method.

Figure 1B:
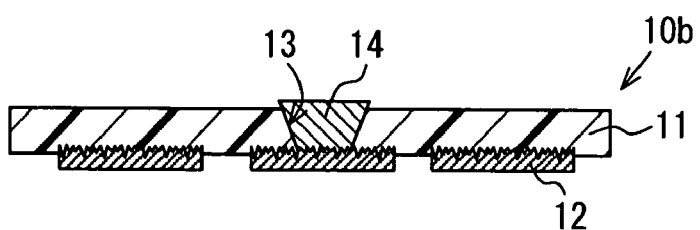
FIG. 1B is a cross-sectional view showing another pattern film having a thermoplastic resin film, a circuit pattern formed on the resin film and a conductor paste filling a via-hole formed through the resin film.

As shown in FIG. 1B, another pattern film 10b is formed by adding conductive paste 14 to the pattern film 10a. A via-hole 13 is formed through the thermoplastic film 11 from its upper surface to reach an upper surface of the circuit pattern 12. The via-hole may be formed by radiating carbon dioxide laser on the thermoplastic film 11. Alternatively, ultraviolet YAG laser or excimer laser may be used in place of the carbon dioxide laser. Though the via-hole may be formed by machining, it is preferable to use the laser because the via-hole is easily made by the laser without damaging the conductor pattern 12.

The via-hole 13 is filled with the conductive paste 14. The conductive paste 14 is made by adding organic solvent to metallic powder such as silver (Ag) or tin (Sn) powder and by mixing them into paste. Glass frit having a low melting point, organic resin or inorganic filler may be additionally mixed with the paste. The conductive paste 14 is supplied to the via-hole 13 by means of a screen printer, a dispenser or the like.

Figure 2:
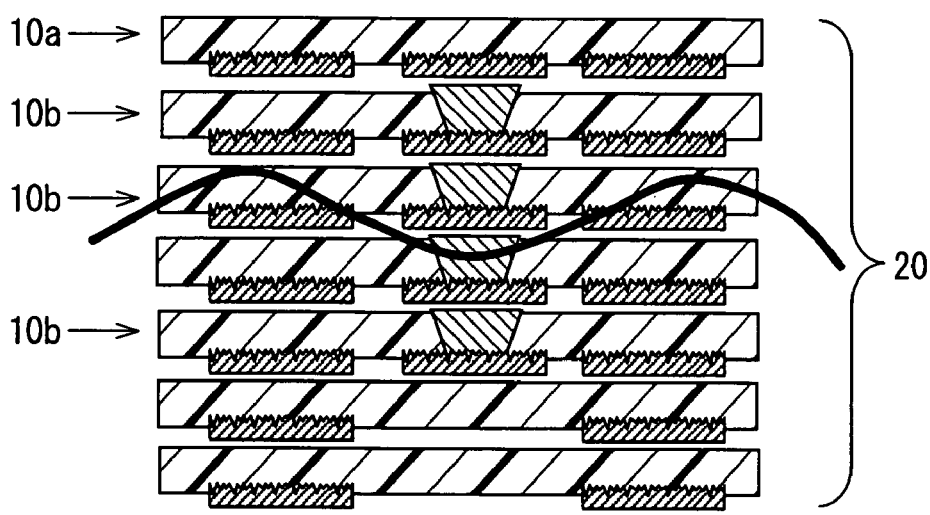
FIG. 2 is a cross-sectional view showing a laminated body including plural pattern films, each pattern film being spaced from each other to better show a laminated structure.

As shown in FIG. 2, the pattern films 10a, 10b are laminated thereby forming a laminated body 20. Though pattern films shown in FIG. 2 are separated from one another, they are laminated in close contact with one another. A thick curved line in FIG. 2 means that there are some more layers laminated though they are not all shown. The same is applied to FIGS. 3, 5, 6, 10 and 11. The upper most pattern film 10a has no via-hole 13 filled with paste 14, two pattern films laminated at the bottom end have no circuit pattern 12 formed at their center portion, and other pattern films 10b are all the same (the circuit pattern 12 is formed all through the rear surface and the via-hole 13 filled with the conductor paste 14 is formed in the middle). The number of laminated pattern films 10a, 10b is, for example, 24 or more. In this particular embodiment, 24 circuit patterns 12 are laminated at both sides of the laminated body 20, while 22 circuit patterns are laminated at the middle portion of the laminated body 20. The configuration of the laminated body 20 is not limited to this example, but the number of laminated circuit patterns 12 may be made different according to positions on the surface (a surface perpendicular to the laminated direction).

Figure 3:
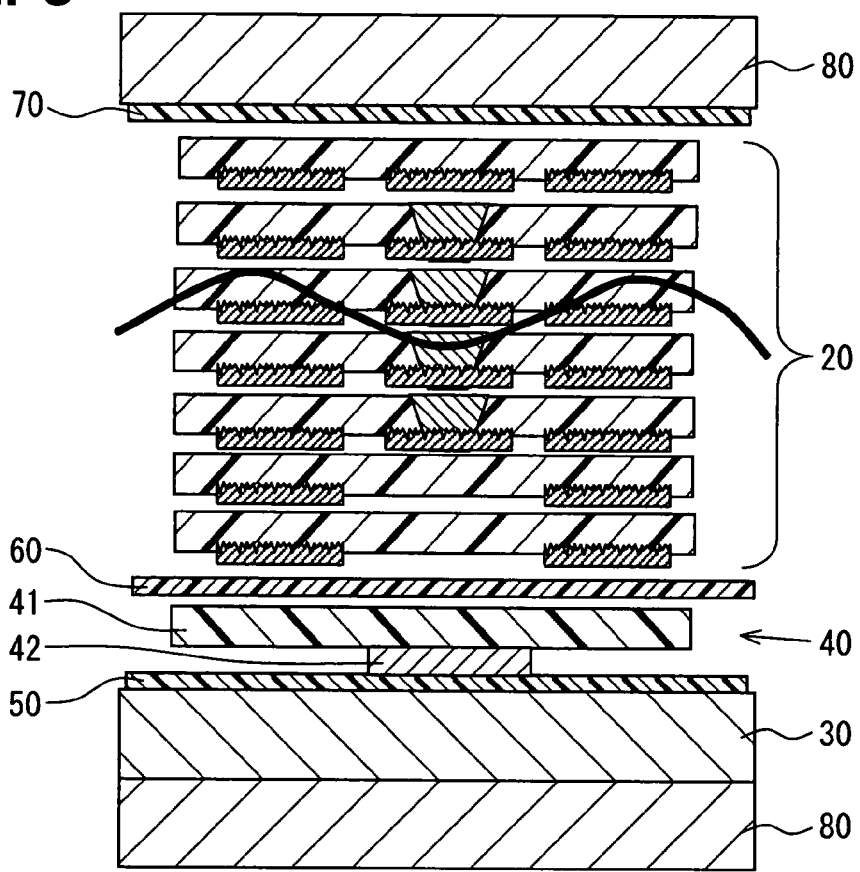
FIG. 3 shows a process for placing the laminated body and sheets including a pressure-adjusting sheet between a pair of hot press plates.

As shown in FIG. 3, the laminated body 20 is placed between a pair of hot press plates 80 together with other sheets and components. From the bottom to the top, sheets and components are placed in the following order: a buffer member 30, a separator film 50, a pressure-adjusting sheet 40, a separator film 60, the laminated body 20, and a separator film 70.

The buffer member 30 is used to suppress an imbalance of the pressure applied to the laminated body 20 from the hot press plates 80. The number of laminated circuit patterns 12 is not uniform as explained above, i.e., the number of the laminated circuit patterns 12 is less at the middle portion than side portions. Therefore, a higher pressure is applied to both sides and a lower pressure is applied to the middle portion. By placing the buffer member 30, the pressure imbalance is alleviated by resiliency of the buffer member 30.

The buffer member 30 has to have resiliency and durability. Metallic, mineral or resin fibers may be used as the buffer member 30. More particularly, the buffer member 30 may be made from the following materials: a non-woven plate or a woven knit or cloth formed by metallic fibers such as stainless steel fibers; a film made from polytetrafluoroethylene resin; a hyper sheet made from Kebler (a trademark); or a sheet made from glass fibers, rock-wool or asbestos. When air has been purged from the laminated body 20 before pressing by the hot press, heat-resistive rubber may be used as the buffer member 30 because only resiliency is required to the buffer member 30 in this case.

Although the pressure imbalance is alleviated by using the buffer member 30, it is required to further improve the uniformity of the pressure applied to the laminated body 20. For this purpose, the pressure-adjusting sheet 40 is used. Especially, when the conductive paste 14 is disposed in the middle portion where the lower pressure is applied compared with that applied to the both sides as in the present embodiment disclosed in FIG. 3, the conductive paste 14 may not be sufficiently converted into an alloy. That is, if the silver and tin particles contained in the conductive paste 14 are not sufficiently pressed, those particles are not completely converted into an alloy though particles may be partially converted into an alloy. If such an incomplete alloy is subjected to repetition of temperature changes, cracks may develop in the incomplete alloy, resulting in an increase in its electrical resistance. If this happens, the circuit board does not properly function.

Figure 4:
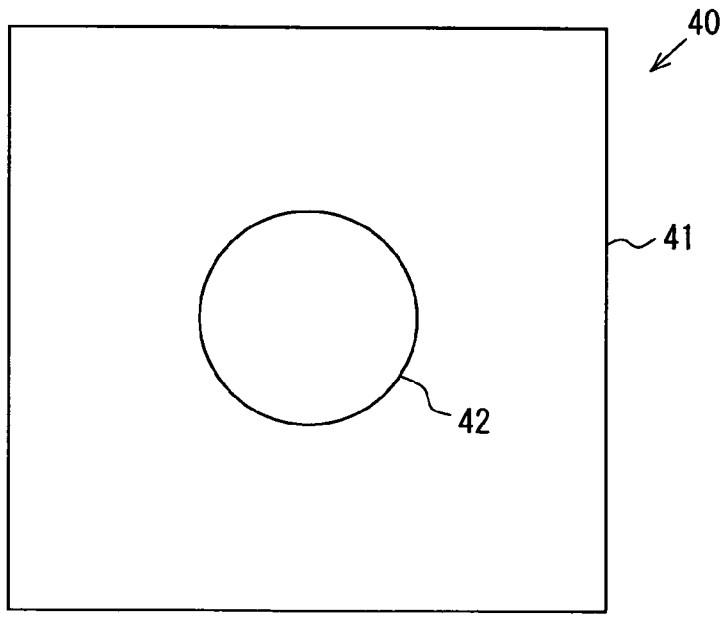
FIG. 4 is a plan view showing the pressure-adjusting sheet having a projected pattern formed thereon.

FIG. 4 shows an example of the pressure-adjusting sheet 40. The pressure-adjusting sheet 40 is composed of an insulating sheet 41 made of a thermoplastic resin such as liquid crystal polymer and a projected pattern 42 formed thereon. The insulating film 41 has a thickness of 12 μm, for example, and the projected pattern 42 having a predetermined height is formed with a metallic material such as copper. The projected pattern 42 is formed at a place or places corresponding to the position where the applied pressure has to be increased.

In this particular example shown in FIG. 3, the projected pattern 42 is formed at the center of the insulating sheet 41. Generally, the positions where the applied pressure has to be increased (i.e., where the number of laminated circuit patterns 12 is less than other positions and/or where the via-holes 13 filled with the conductive paste 14 are formed) are calculated by means of CAD, and an etching sheet is formed. A pattern of the projected pattern 42 is formed on the insulating sheet 41 using the etching sheet.

The separator films 50, 60, 70 are made of polyimide, for example. They have to be resilient to be deformed according to deformation of the pressure-adjusting sheet 40 and easy to be separated from the neighboring layers after the pressing process is completed.

Figure 5:
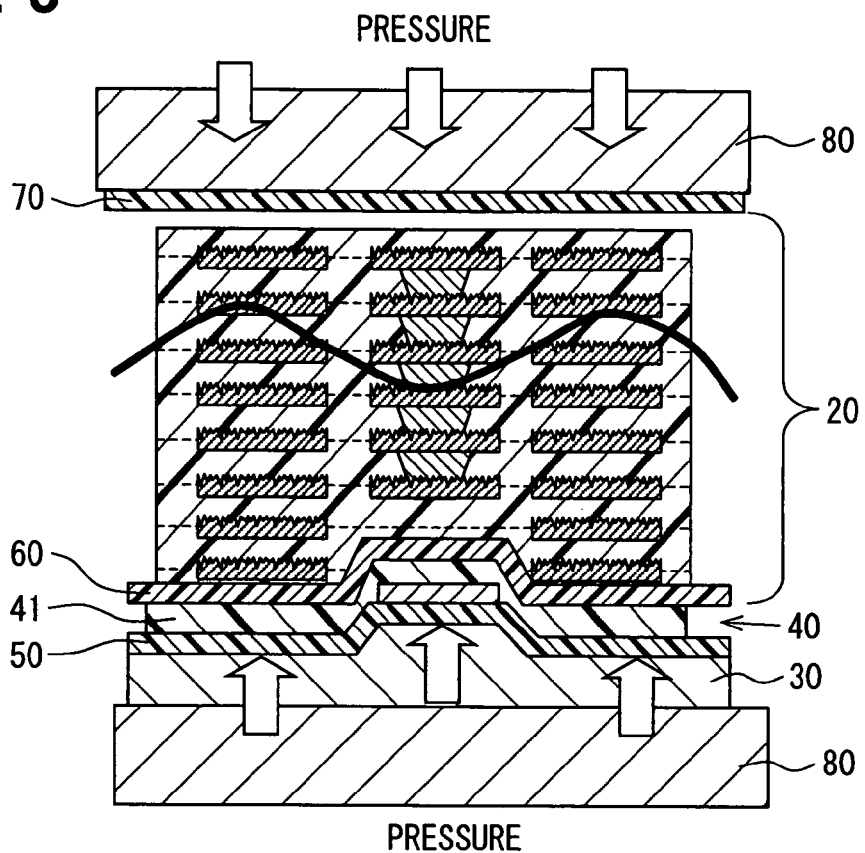
FIG. 5 is a cross-sectional view showing the laminated body pressed and heated by a hot press.

After placing the laminated body 20 and other layers between the pair of hot press plates 80, the laminated body 20 is pressed and heated by the hot press, as shown in FIG. 5. The laminated body 20 is heated to a temperature in a range of 200-400° C. and pressed with a pressure of 5.0 MPa, for example. The hot press plate 80 is made of a material such as stainless steel and is heated by supplying electric current thereto. Alternatively, the pot press plate 80 may be heated by an electric heater embedded therein or a hot liquid passage embedded therein.

By pressing the laminated body 20 while heating, the thermoplastic resin film 11 is softened and connected to each other. The conductive paste 14 in the via-hole 13 is converted into an alloy. More particularly, the tin particles in the conductive paste 14 are liquefied and cover the silver particles, and thereby forming an alloy. Further, tin particles in the conductive paste 14 and copper forming the circuit pattern 12 diffuse into each other, thereby forming electrical connections.

In the heating and pressing process in the hot press, the pressure-adjusting sheet 40 is deformed as shown in FIG. 5. The middle portion of the laminated body 20, where the number of laminated circuit patterns 12 is less and a resistive force against the applied pressure is low, is pushed up and deformed by the pressure-adjusting sheet 40 and the buffer member 30. In this manner, a substantially uniform pressure is applied to the laminated body 20.

Figure 6:
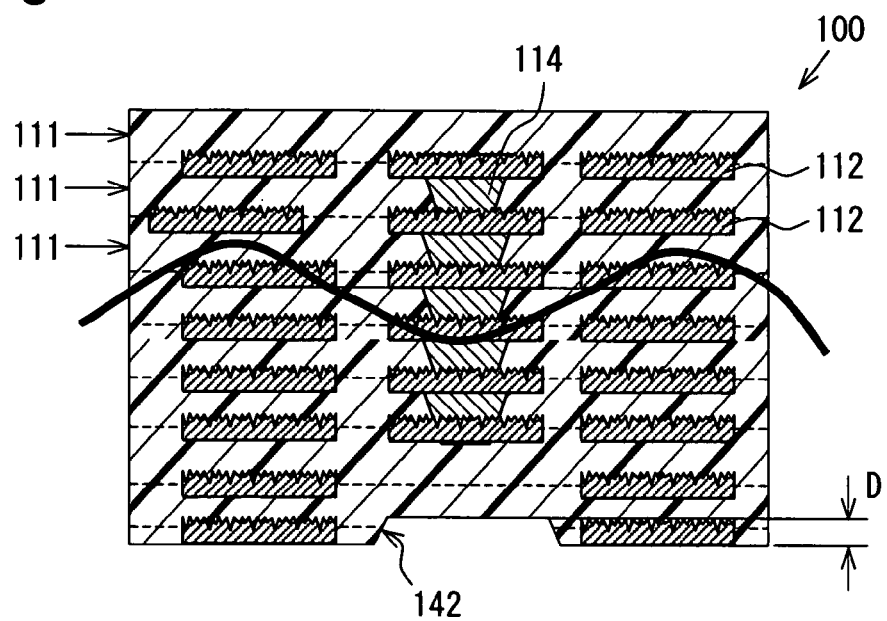
FIG. 6 is a cross-sectional view showing a laminated multi-layer circuit board that is formed into an integral body by the hot press.

Upon completion of the heating and pressing process, the laminated body 20 is converted into a laminated multi-layer circuit board 100 as shown in FIG. 6. The separator films 50, 60 and 70 are removed from the completed circuit board 100. As shown in FIG. 6, the thermoplastic resin films 11 are converted into insulating layers 111, the circuit patterns 12 into conductor layers 112 and the conductive paste 14 into inter-layer connecting portions 114. On the rear surface of the circuit board 100, a depressed portion 142 corresponding to the projected pattern 42 of the pressure-adjusting sheet 40 is formed. In the laminated multi-layer circuit board 100, the insulating layers 111 and the conductor layers 112 are alternately laminated, and the conductor layers 112 are electrically connected by the inter-layer connecting portions 114.

Figure 7:
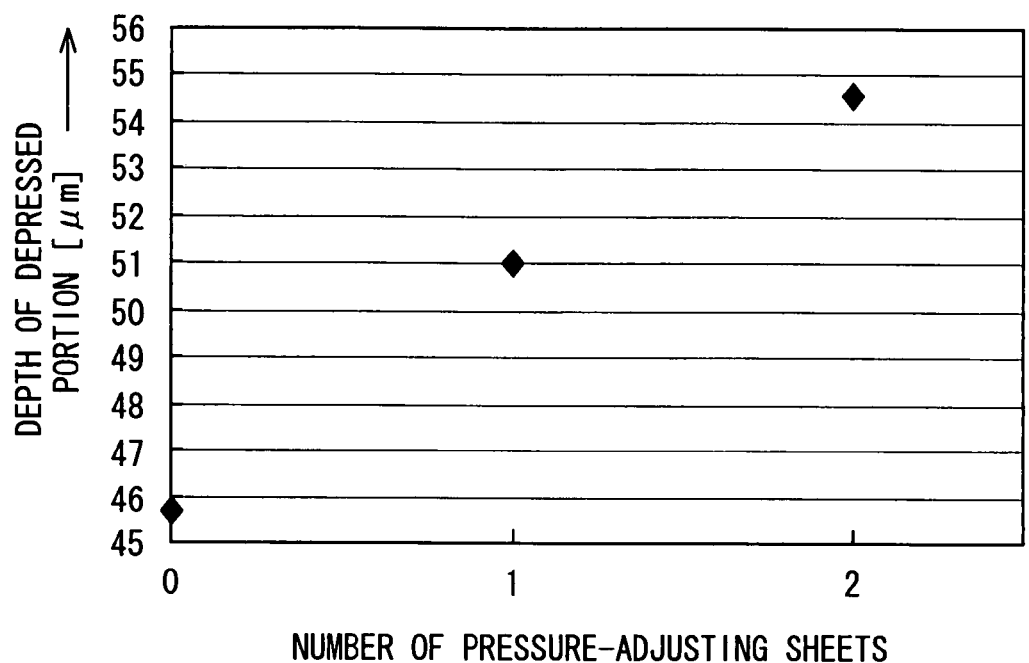
FIG. 7 is a graph showing a relation between a depth of a depressed portion formed on an surface of the laminated multi-layer circuit board and the number of pressure-adjusting sheets used in a process of pressing the laminated body.

Referring to graphs shown in FIGS. 7-9, some properties of the circuit board 100 will be explained. With reference to FIG. 7, a depth D (shown in FIG. 6) of the depressed portion 142 relative to the number of pressure-adjusting sheets 40 used in the pressing and heating process will be explained. A total thickness of the laminated layers at both sides, where the number of laminated circuit patterns 12 are large, before the pressing and heating process, is about 1300 μm. A total thickness of the laminated layers at the middle portion, where the number of laminated circuit patterns 12 are small, before the pressing and heating process, is about 1200 μm. That is, the thickness difference is about 100 μm. If uniform pressure and heat are applied to the laminated body 20, the depth D of the depressed portion 142 would be 100 μm in an ideal situation.

In an actual situation, when no pressure-adjusting sheet 40 is used, the depth D of the depressed portion 142 is about 46 μm as shown in FIG. 7. When one pressure-adjusting sheet 40 is used, the depth D becomes about 51 μm, and when two pressure-adjusting sheets are used, the depth D becomes about 54.5 μm. This proves that the uniformity of the applied pressure to the laminated body 20 is improved by using the pressure-adjusting sheet 40. By using two sheets, more improvement is seen.

Figure 8:
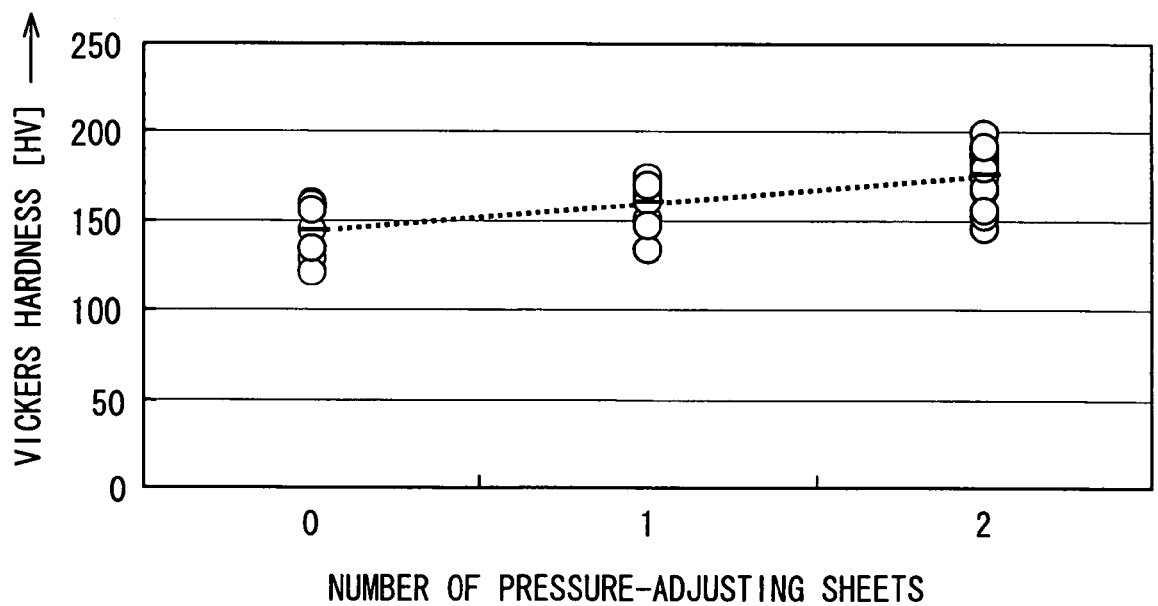
FIG. 8 is a graph showing a relation between Vickers hardness of an inter-layer connecting portion and the number of pressure-adjusting sheets used in a process of pressing the laminated body.

FIG. 8 shows Vickers hardness of the inter-layer connecting portion 114 relative to the number of pressure-adjusting sheets 40 used in the pressing and heating process. When no pressure-adjusting sheet 40 is used, the Vickers hardness is in a range of 110-155 HV (several samples are tested under the same conditions). When one pressure-adjusting sheet 40 is used, the Vickers hardness is in a range of 130-175 HV. When two pressure-adjusting sheets 40 are used, the Vickers hardness is in a range of 145-205 HV. This means that an amount of pressure applied to the conductive paste 14, which is located in the middle portion where a less pressure is applied, is increased by using the pressure-adjusting layer 40. By using two of them, the pressure is further increased.

Figure 9:
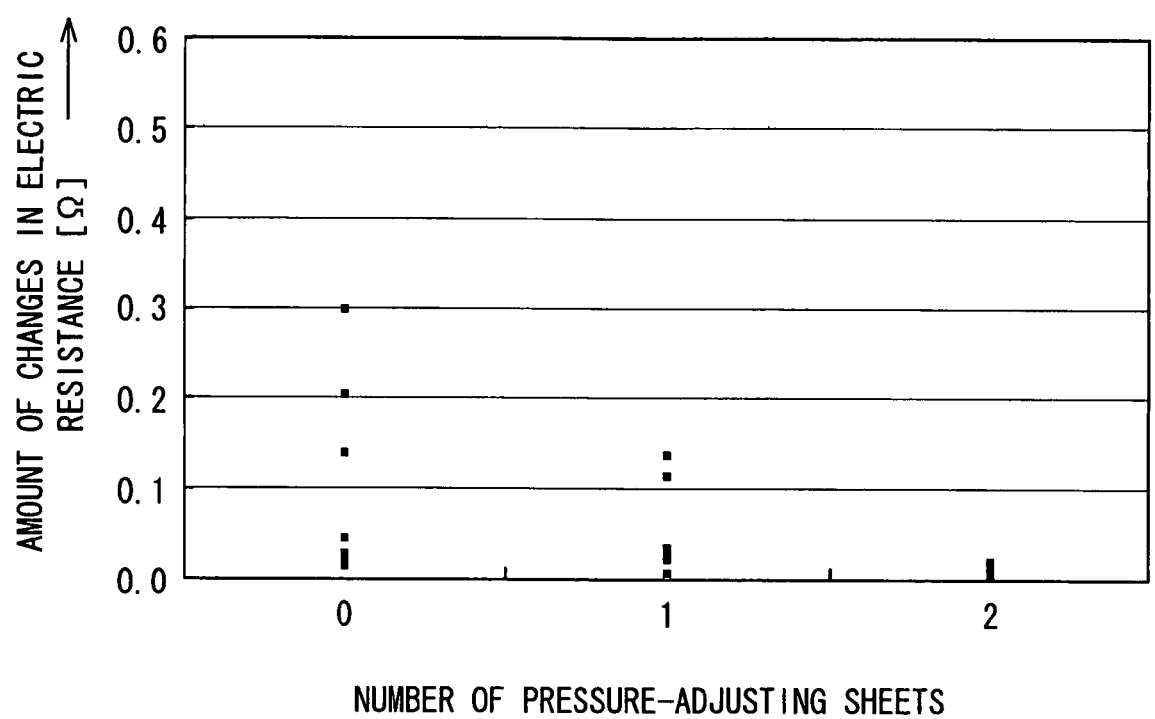
FIG. 9 is a graph showing a relation between an amount of changes in electric resistance of the inter-layer connecting portion and the number of pressure-adjusting sheets used in a process of pressing the laminated body.

FIG. 9 shows an amount of changes in the electric resistance of the inter-layer connecting portion 114 during a temperature-cycle test. In the test, temperature is changed in a range of minus 55-plus 125° C. about 1000 times. During that test a difference between the highest resistance and the lowest resistance is measured. When no pressure-adjusting sheet 40 is used, the resistance difference is in a range of 0.01-0.3Ω. When one pressure-adjusting sheet 40 is used, the resistance difference is in a range of 0.01-0.15Ω. When two pressure-adjusting sheets 40 are used, the resistance difference is in a range of 0.01-0.02Ω.

This means that an amount of resistance changes is large when no pressure-adjusting sheet 40 is used, because a sufficient pressure for combining the particles in the conductive paste 14 is not applied. If the metallic particles in the conductive paste 14 are not sufficiently combined, the resistance of the inter-layer connecting portion 114 changes in a higher range according to the temperature changes. By using the pressure-adjusting sheet 40, an amount of resistance changes is suppressed. By using two of them, the amount of resistance changes is further suppressed. This means that the sufficient pressure is applied to the conductive paste 14 located in the middle portion of the laminated body 20 by using the pressure-adjusting sheet 40.

The present invention is not limited to the embodiment described above, but it may be variously modified. For example, the insulating sheet 41 for forming the pressure-adjusting sheet 40 may be made of other materials than the liquid crystal polymer, such as thermosetting resin or metallic foils, as long as the materials have heat-resistive property. The thickness of the insulating sheet 41 is not limited to a uniform thickness of 12 μm. Portions of the insulating sheet 41 corresponding to positions of the laminated body 20, where the applied pressure is to be increased, may be made thicker than other portions.

The positions of the separator films 50, 60 and 70 are not limited to those shown in FIG. 3. Their positions may be variously chosen according to actual needs in the pressing process. As to the separator film 50 positioned on the buffer member 30, it is not necessarily required to have a property of easy peeling.

Figure 10:
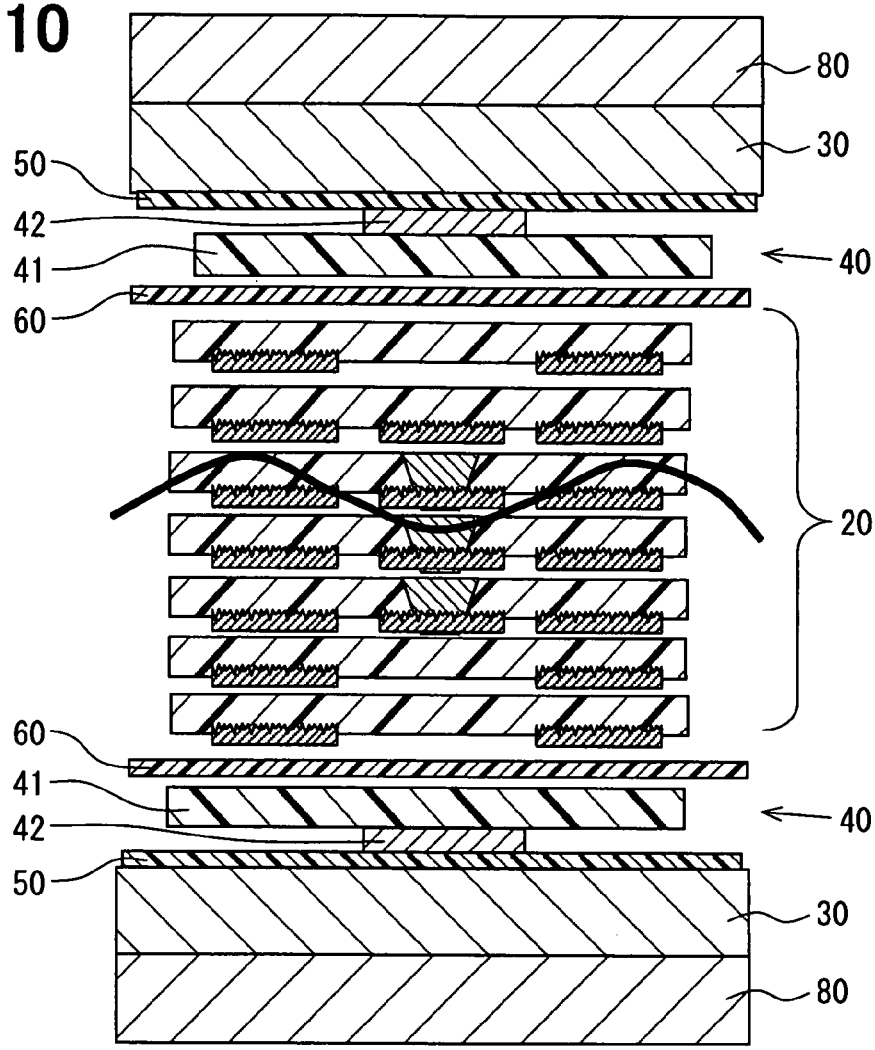
FIG. 10 is a cross-sectional view showing a laminated body and a pair of pressure-adjusting sheets placed in a hot press, as a modified form of the embodiment shown in FIG. 3.
Figure 11:
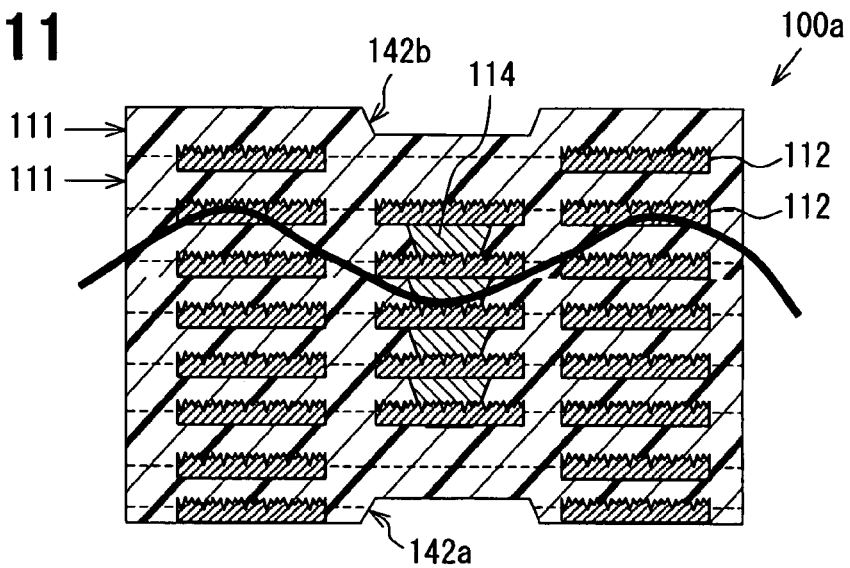
FIG. 11 is a cross-sectional view showing a laminated multi-layer circuit board having depressed portions on both the upper and the lower surfaces, as a modified form of the embodiment shown in FIG. 6.

Though the pressure-adjusting sheet 40 is positioned underneath the bottom surface of the laminated body 20 in the foregoing embodiment, it may be positioned on the upper surface of the laminated body 20. As shown in FIG. 10, the pressure-adjusting sheet 40 may be positioned on both of the upper and bottom surfaces of the laminated body 20. In this case, the completed circuit board 100a has two depressed portions, an upper depressed portion 142b and a lower depressed portion 142a, as shown in FIG. 11.

The projected pattern 42 may be made by various methods other than etching a metallic film or plate as long as the projected pattern 42 is formed at a desired position or positions where the applied pressure is required to be increased. The height of the projected pattern 42 may not be uniform, but it may be varied from position to position so that a uniform pressure is applied to laminated body 20.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of making a multi-layer circuit board, comprising:
    forming continuous deformable pattern films, each being deformable and having a circuit pattern formed on a thermoplastic resin film;
    laminating a plurality of the continuous deformable pattern films, thereby forming a deformable laminated body;
    placing the laminated body between a pair of hot press plates together with a pressure-adjusting sheet and a buffer member, the pressure-adjusting sheet having thereon a projected portion so that the projected portion is located at a position where a number of laminated circuit patterns is less than a number of laminated circuit patterns at other positions; and
    pressing the laminated body between the pair of hot press plates, while heating the same, thereby forming an integral body of the multi-layer circuit board, wherein
    in pressing and heating the laminated body between the pair of hot press plates, the buffer member suppresses an imbalance of pressure applied to the laminated body from the pair of hot press plates and the pressure-adjusting sheet having the projected portion further improves uniformity of the pressure applied to the laminated body in such a way that:
        the projected portion increases the pressure at the position where the number of laminated circuit patterns is less than the number of laminated circuit patterns at the other positions; and
        the projected portion forms a depressed portion at least either on an upper or a lower surface of the multi-layer circuit board at a position corresponding to the position where the number of laminated circuit patterns is less than the number of laminated circuit patterns at the other positions.

2. The method according to claim 1, wherein:
    the depressed portion is formed at a position where the number of laminated circuit patterns is less than the number of laminated circuit patterns at the other positions by a predetermined number.

3. The method according claim 1, wherein:
    via-holes each connecting neighboring conductor layers are filled with conductive paste, the conductive paste including metal particles composed of more than two kinds of metallic materials;
    in the pressing step, the conductive paste in each via-hole is converted into an alloy to form an inter-layer connecting portion; and
    the depressed portion is formed at a position corresponding to a place where at least one inter-layer connecting portion is formed.

4. The method according to claim 1, wherein:
    the depressed portion is formed with a depth determined according to the number of laminated circuit patterns at a position where the depressed portion is formed.

5. The method according to claim 4, wherein:
    the depth of the depressed portion is inversely proportional to the number of the laminated circuit patterns.

6. The method according to claim 1, wherein
    the depressed portion is formed only on one of the upper surface and the lower surface of the multi-layer circuit board.

7. The method according to claim 1, wherein:
    the depressed portion is formed on both surfaces of the multi-layer circuit board.

8. A method of making a multi-layer circuit board, comprising: forming continuous deformable pattern films, each being deformable and having a circuit pattern formed on a thermoplastic resin film; laminating a plurality of the continuous deformable pattern films, thereby forming a deformable laminated body; placing the laminated body between a pair of hot press plates together with a pressure-adjusting sheet having thereon a projected portion and at least one separator film so that the projected portion is located at a position where a number of laminated circuit patterns is less than a number of laminated circuit patterns at other positions; and pressing the laminated body between the pair of hot press plates, while heating the same, thereby forming an integral body of the multi-layer circuit board, wherein the projected portion forms a depressed portion at least either on an upper or a lower surface of the multi-layer circuit board at a position corresponding to the position where the number of laminated circuit patterns is less than the number of laminated circuit patterns at the other positions, and the projected portion has a height and position that enables the projected portion to apply increased pressure to the deformed laminated body at the position where the number of laminated circuit patterns is less than the number of laminated circuit patterns at the other positions.

9. The method according to claim 8, further comprising:
    removing the at least one separator film from the integral body after the pressing of the laminated body between the pair of hot press plates is completed.

10. A method of making a multi-layer circuit board, comprising: forming continuous deformable pattern films, each being deformable and having a circuit pattern formed on a thermoplastic resin film; laminating a plurality of the continuous deformable pattern films, thereby forming a deformable laminated body; placing the laminated body between a pair of hot press plates together with a buffer member, a pressure-adjusting sheet having thereon a projected portion, and at least one separator film formed over the buffer member and the projected portion, so that the projected portion is located at a position where a number of laminated circuit patterns is less than a number of laminated circuit patterns at other positions; and pressing the laminated body between the pair of hot press plates, while heating the same, thereby forming an integral body of the multi-layer circuit board, wherein in pressing and heating the laminated body between the pair of hot press plates, resiliency of the buffer member alleviates an imbalance of pressure applied to the laminated body from the pair of hot press plates and the pressure-adjusting sheet is deformed and pressed against the laminated body to further improve uniformity of the pressure applied to the laminated body in such a way that: the projected portion of the pressure-adjusting sheet increases the pressure at the position where the number of laminated circuit patterns is less than the number of laminated circuit patterns at the other positions, in such a way that the projected portion of the pressure-adjusting sheet forms a depressed portion at least either on an upper or a lower surface of the multi-layer circuit board at a position corresponding to the position where the number of laminated circuit patterns is less than the number of laminated circuit patterns at the other positions.

11. The method according to claim 10, further comprising:
    removing the at least one separator film from the integral body after the pressing of the laminated body between the pair of hot press plates is completed.

12. The method according to claim 8, further comprising:
removing the at least one separator film from the integral body after the pressing of the laminated body between the pair of hot press plates is completed.

13. The method of making the multi-layer circuit board according to claim 1, wherein: the pressure-adjusting sheet is composed of an insulating sheet and the projected portion; the insulating sheet is made of a thermoplastic resin; and the projected portion is formed with a metal material.

14. The method of making the multi-layer circuit board according to claim 8, wherein:
the pressure-adjusting sheet is composed of an insulating sheet and the projected portion;
the insulating sheet is made of a thermoplastic resin; and
the projected portion is formed with a metal material.

15. The method of making the multi-layer circuit board according to claim 10, wherein:
the pressure-adjusting sheet is composed of an insulating sheet and the projected portion;
the insulating sheet is made of a thermoplastic resin; and
the projected portion is formed with a metal material.

* * * * *